United States Patent
Reynolds et al.

(10) Patent No.: US 10,314,213 B2
(45) Date of Patent: *Jun. 4, 2019

(54) ELECTRONIC HEADSET VENTING SYSTEMS AND METHODS

(71) Applicant: Grail Gear LLC, Boise, ID (US)

(72) Inventors: Collin Reynolds, Boise, ID (US); Cain Adams, Meridian, ID (US)

(73) Assignee: Grail Gear LLC, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/963,391

(22) Filed: Apr. 26, 2018

(65) Prior Publication Data
US 2019/0132999 A1     May 2, 2019

Related U.S. Application Data

(63) Continuation of application No. 15/284,362, filed on Oct. 3, 2016, now Pat. No. 9,980,416.

(51) Int. Cl.
| | |
|---|---|
| *H05K 7/20* | (2006.01) |
| *G02B 27/01* | (2006.01) |
| *H05K 5/02* | (2006.01) |
| *H05K 5/00* | (2006.01) |
| *G02B 27/02* | (2006.01) |

(52) U.S. Cl.
CPC ..... *H05K 7/20972* (2013.01); *G02B 27/0176* (2013.01); *G02B 27/028* (2013.01); *H05K 5/0017* (2013.01); *H05K 5/0213* (2013.01)

(58) Field of Classification Search
CPC ....................................................... G06F 1/163

USPC ........................................................... 361/695
See application file for complete search history.

(56) References Cited

U.S. PATENT DOCUMENTS

| | | | | |
|---|---|---|---|---|
| 6,409,338 | B1* | 6/2002 | Jewell | G02C 11/08 2/171.3 |
| 8,695,121 | B2* | 4/2014 | Nolan | A42B 3/286 2/171.3 |
| 2006/0017654 | A1* | 1/2006 | Romo | G06F 3/01 345/7 |
| 2011/0268290 | A1* | 11/2011 | Lee | H04R 1/1091 381/74 |
| 2014/0102442 | A1* | 4/2014 | Wilson | F24F 9/00 128/200.28 |
| 2014/0333773 | A1* | 11/2014 | Davis | H04N 5/2252 348/158 |
| 2016/0007672 | A1* | 1/2016 | Ku | A42B 1/24 2/171.3 |

(Continued)

OTHER PUBLICATIONS

Non-Final Office Action dated Sep. 5, 2107 for U.S. Appl. No. 15/284,362.

(Continued)

*Primary Examiner* — Mukundbhai G Patel
(74) *Attorney, Agent, or Firm* — Stoel Rives LLP; R. Whitney Johnson

(57) ABSTRACT

A venting system for an electronic headset including a fan to be disposed on an outer surface of the electronic headset, a channel to receive air from the fan and direct air toward an outlet. An air channel ring may be mountable to the electronic headset. The air channel ring receives air from the outlet and directs air to an interior portion of the electronic headset.

17 Claims, 3 Drawing Sheets

(56) References Cited

U.S. PATENT DOCUMENTS

2017/0168303 A1* 6/2017 Petrov ................ G02B 27/0176
2018/0098465 A1 4/2018 Reynolds

OTHER PUBLICATIONS

Notice of Allowance dated Jan. 22, 2018 for U.S. Appl. No. 15/284,362.

* cited by examiner

ELECTRONIC HEADSET VENTING SYSTEMS AND METHODS

CROSS-REFERENCE TO RELATED APPLICATIONS

This application is a continuation of U.S. patent application Ser. No. 15/284,362, filed Oct. 3, 2016, and titled "Electronic Headset Venting Systems and Methods," which is hereby incorporated by reference in its entirety.

TECHNICAL FIELD

This application relates to electronic headsets and more particularly to virtual reality headsets, augmented reality headsets, and the like.

BACKGROUND

Electronic headsets, such as virtual reality headsets or augmented reality headsets, attach to a user's head and may be worn for extended periods of time without being removed. The electronic headsets are designed so that light does not enter an interior portion of the electronic headset and a user is able to see a display.

Due to this design, air is often unable to flow within the interior of the electronic headset when worn by a user, which can result in the display screen of the electronic headset fogging up. Venting that can help reduce or prevent the fogging of the display screen on the electronic headsets may be desirable.

BRIEF DESCRIPTION OF THE DRAWINGS

The written disclosure herein describes illustrative embodiments that are non-limiting and non-exhaustive. Reference is made to certain of such illustrative embodiments that are depicted in the figures, in which.

DETAILED DESCRIPTION OF PREFERRED EMBODIMENTS

Electronic headsets, such as virtual reality headsets or augmented reality headsets, may be worn on user's head for extended periods of time without being removed. The electronic headsets, such as virtual reality headsets, may be designed so that light does not enter an interior area of a housing of the electronic headset and thereby allow a user to better view a lit display within the housing.

A design of an electronic headset that does not allow light to enter may also suffer from a drawback that air is often unable to flow within the interior of the electronic headset when worn by a user, which can result in the display screen of the electronic headset fogging up. Venting that can help reduce or prevent the fogging of the display screen on the electronic headsets may be desirable.

The components of the embodiments as generally described and illustrated in the figures herein can be arranged and designed in a wide variety of different configurations. Thus, the following more detailed description of various embodiments, as represented in the figures, is not intended to limit the scope of the present disclosure, but is merely representative of various embodiments. While various aspects of the embodiments are presented in drawings, the drawings are not necessarily drawn to scale unless specifically indicated.

The phrase "coupled to" is broad enough to refer to any suitable coupling or other form of interaction between two or more entities. Thus, two components may be coupled to each other even though they are not in direct contact with each other. For example, two components may be coupled to one another through an intermediate component. The phrase "attached to" refers to interactions between two or more entities which are in direct contact with each other and/or are separated from each other only by a fastener of any suitable variety (e.g., an adhesive). The phrase "fluid communication" is used in its ordinary sense, and is broad enough to refer to arrangements in which a fluid (e.g., a gas or a liquid) can flow from one element to another element when the elements are in fluid communication with each other.

Figure 1:
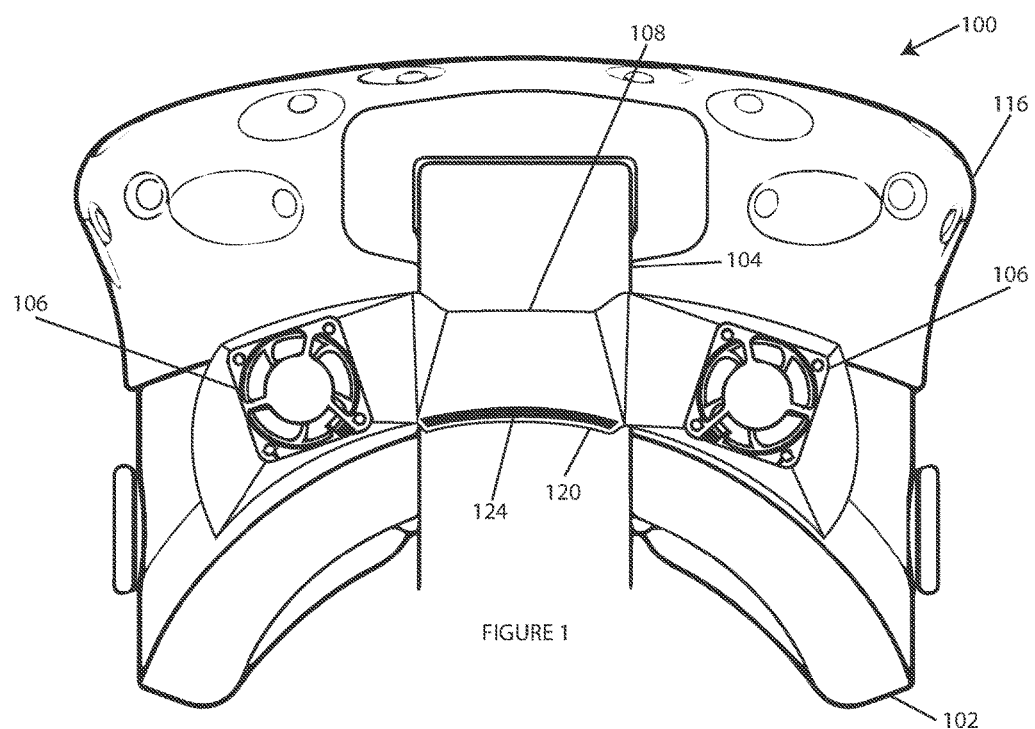
FIG. 1 illustrates a top view of an electronic headset including a venting system, according to one embodiment of the present disclosure.
Figure 2:
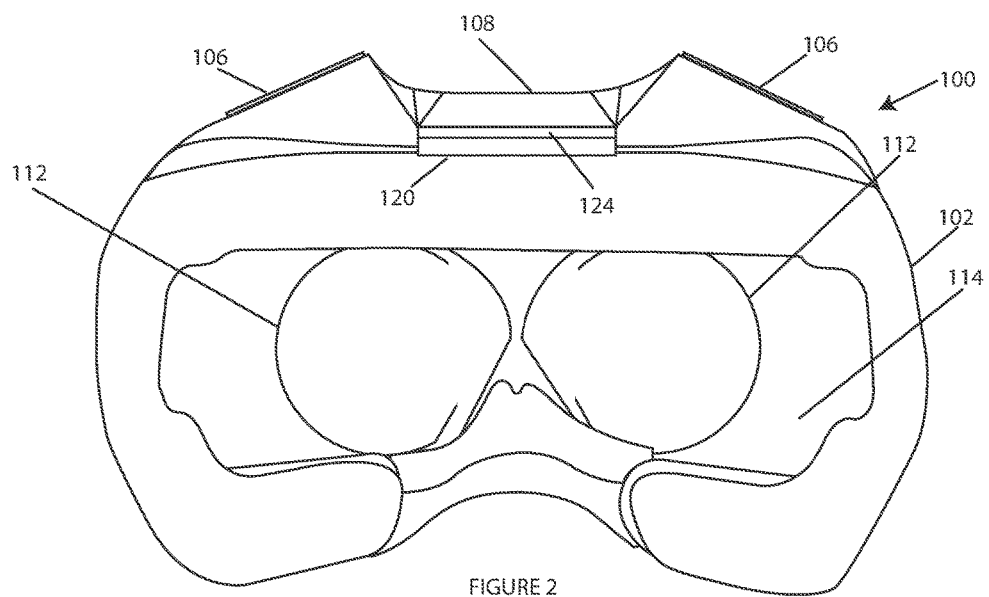
FIG. 2 illustrates a front view of the electronic headset of FIG. 1.
Figure 3:
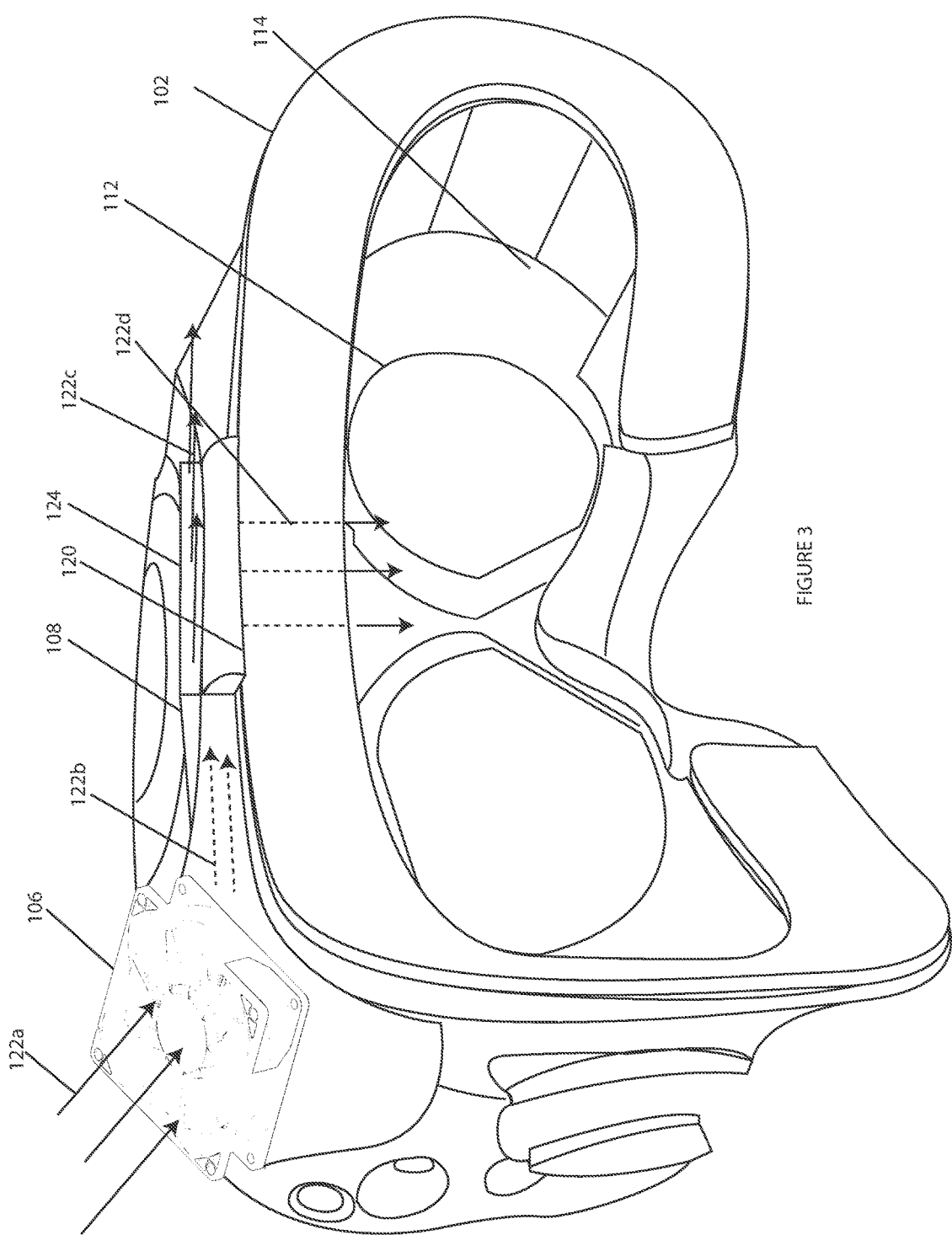
FIG. 3 illustrates an isometric view of the electronic headset of FIG. 1.

FIG. 1 illustrates a top view of an electronic headset 100, according to one embodiment of the disclosed technology. FIG. 2 illustrates a back view of the electronic headset 100 and FIG. 3 illustrates an isometric view of the electronic headset 100. The electronic headset 100 may be, for example, a virtual reality headset. The electronic headset 100 includes a main body 116 (e.g., a housing), a face mask 102, a strap 104 to mount or otherwise couple the headset to a user's head, a display 112, and a venting system, which will be discussed in more detail below and includes at least one fan 106, a top channel 108, and an air channel ring 110 (shown in FIGS. 4 and 5). In some embodiments, the venting system may be included in a kit and be retrofit to and/or removable from the electronic headset 100, as discussed in more detail below. In other embodiments, the venting system may be integrated into the electronic headset 100.

The main body 116 may house and/or support the face mask 102, the display 112, and venting system. The main body 116 may house or otherwise provide or include a display 112 and may be configured to create an interior 114 to provide an offset distance between the display 112 and eyes of the user to enable the user to view and focus on the content presented on the display 112. The interior 114 of the electronic headset 100 is defined by main body 116, the face mask 102, and/or the display 112 and comprises the space there between.

The face mask 102 is positioned at a user-facing edge of the main body 116. The face mask 102 is configured to abut a user's face when worn by the user. The face mask 102 may be formed of foam, rubber, or other elastomeric material to provide a soft cushioning against the user's face. The face mask 102 limits or even prevents external light from entering the interior 114 (e.g., interior space or cavity between a face of the user and the display 112) of the electronic headset 100. The face mask 102 may also enable the user to comfortably wear the electronic headset 100.

The venting system embodiment shown in FIGS. 1 and 2 includes two fans 106 shown on an exterior top portion of the main body 116 of the electronic headset 100. Although FIGS. 1 and 2 illustrate two fans 106, any number of fans 106 may be used, including a single fan. The fans 106 may be battery operated or may be powered by a power cord. For example, the fans 106 may be powered by a USB connection to a USB port of the electronic headset 100. In some embodiments, the fans 106 are 30 mm×30 mm×10 mm fans. However, any size fan may be used that may be suitable to mount onto, for example, an external surface of the main body 116 of the electronic headset 100.

The display 112 of the electronic headset 100 is shown in FIG. 2. The display 112 may be a lens or a screen for a viewer to view an image. In other words, the display 112 may present content (e.g., images and/or video) for viewing by a user wearing the electronic headset 100 or other viewer of the electronic headset 100.

The fans 106 and top channel 108 may be integrated together as a single component that is removably mounted to the main body 116 of the electronic headset 100. In other embodiments, the fans 106 and the top channel 108 can be separate components that are each removably mounted to the main body 116 of the electronic headset 100. The fans 106 and top channel 108 may be removably mounted by an adhesive, such as removable sticky tape. In other embodiments, the fans 106 and top channel 108 may be removably mounted by other means, such as a loop and hook fastener, clips, clamps, snaps, and other suitable fasteners as will be understood by one of ordinary skill in the art with the benefit of this disclosure. In other embodiments, the fans 106 and/or top channel 108 are permanently mounted to the main body 116 of the electronic headset 100. In such embodiments with a permanently mounted venting system, according to the present disclosure, the top channel 108 may be integrally formed with the main body 116 of the electronic headset 100. For example, the main body 116 including the top channel 108 may be formed by an injection molding process to integrally form the top channel 108 along an upper surface of the main body 116.

Arrows 122a-122d (collectively 122) in FIG. 3 indicate the air flow movement through the venting system. The fans 106 rotate to generate airflow, as represented by arrows 122a. The fans 106 generate airflow that is received by the top channel 108. That is, the top channel 108 is in fluid communication with the fans 106 and receives air moved by the fans 106. The top channel 108 directs or channels air across at least a portion of the exterior surface of the main body 116, as shown by arrows 122b, and has an outlet 120 that is in fluid communication with the air channel ring 110. The top channel 108 directs the air toward the outlet 120, to or even over an edge of the main body 116, and to the air channel ring 110. The air channel ring 110 directs air into the interior 114 of the electronic device 100 and toward the display 112 to provide airflow to and venting of the interior 114 and/or the display 112. Arrows 122d show the flow of air from the outlet 120 of the top channel 108 through the air channel ring 100 (not shown) and into the interior 114 of the electronic headset 100. Air flowing into the interior 114 helps prevent the display 112 from fogging during extended use of the electronic headset 100. The top channel 108 may also include another outlet 124 that directs air toward a user's forehead. This provides airflow directly toward a user and may help cool a user while using the electronic headset 100. Arrows 122c indicate the airflow from the top channel 108 to the user's forehead through the other outlet 124.

Figure 4:
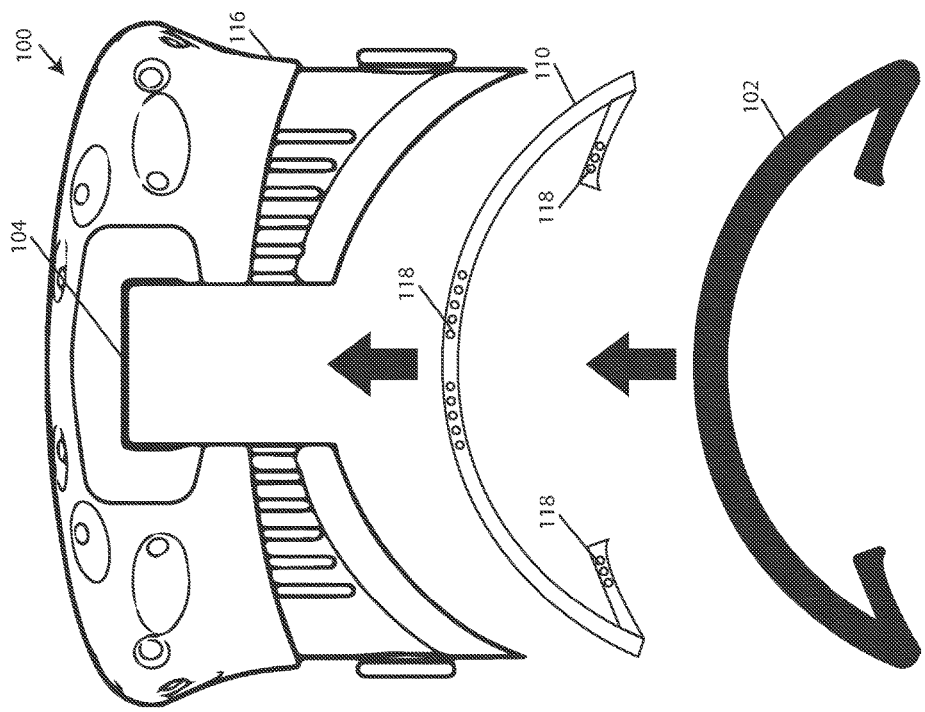
FIG. 4 illustrates an exploded top view of the electronic headset and an air channel ring of the venting system.
Figure 5:
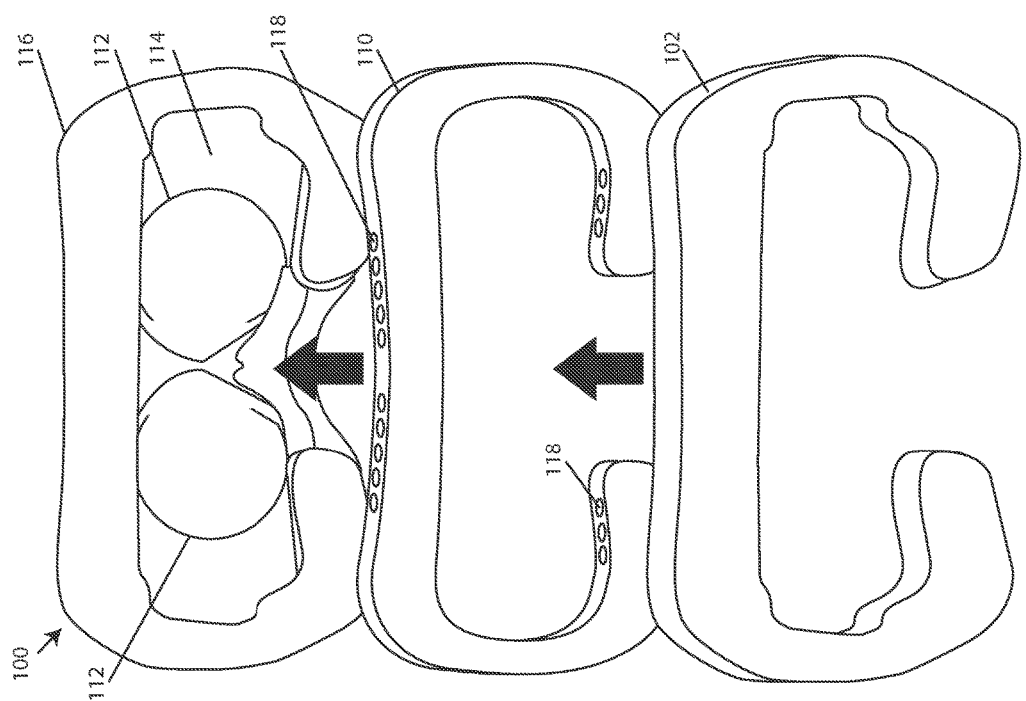
FIG. 5 illustrates an exploded front view similar to FIG. 4.

The air channel ring 110 is illustrated in detail in FIGS. 4 and 5. The air channel ring 110 is coupled between the main body 116 of the electronic headset 100 and the face mask 102. The air channel ring 110 may include a plurality of vents 118.

In some embodiments, the air channel ring 110 is a solid, hard plastic. The air channel ring 110 includes vents 118 that extend through the air channel ring 110. The air channel ring 110 defines vents 118 (e.g., apertures, channels, or the like) that extend from an outward surface (e.g., facing external to the headset, opposite the interior 114) to an inner surface (e.g., facing toward the interior 114) of the air channel ring 110. Vents 118 may be provided on a top portion of the air channel ring 118 as well as on a bottom portion, as seen in FIGS. 4 and 5. The top channel 108 may direct air to an outer portion of vents 118 in a top portion of the air channel ring 118, through the vents 118 (and thereby through the air channel ring), and into the interior 114. In such embodiments, the outlet 120 covers the vents 118 on the top portion of the air channel ring to prevent light from entering the interior 114 of the electronic headset 100. Vents 118 provided on the bottom portion, or any other portion, of the air channel ring 110 may allow air in the interior 114 to escape to the exterior, thereby venting the interior 114. Other vents 118 may be provided on any location of the air channel ring 110 that will direct air to the interior 114 of the electronic device 100 and toward the display 112 and/or from the interior 114 and to the exterior or environment around the electronic.

In some embodiments, the air channel ring 110 is a hollow, hard plastic, and the vents 118 may extend from a lumen and through a wall of the air channel ring 110. Some vents 118 may be an inlet only for receiving air from the outlet 120 while other vents 118 direct the air into the interior 114 of the electronic headset 110. For example, if the air channel ring 110 in a hollow, hard plastic in FIGS. 4 and 5, air received at the top vents 118 in direct fluid connection with the outlet 120 may flow through a lumen of the air channel ring 110 and out through the bottom vents 118 and into the interior 114 of the electronic headset 100 towards the display 112.

In both the embodiments discussed above, the air channel ring 110 is a flexible, hard plastic. The air channel ring 110, as seen in FIGS. 4 and 5, couples between the face mask 102 and the main body 116 of the electronic headset 100. The air channel ring 110 removably couples to the face mask 102 and the main body 116 via a fastener. In some embodiments, the fastener may be, for example, a hook and loop fastener (e.g., Velcro) or a removable adhesive, such that the air channel ring 110 can be removed from the electronic headset 100.

In other embodiments, the air channel ring 110 may be permanently coupled between the face mask 102 and the main body 116.

In some embodiments, the air channel ring 110 and the top channel 108 may be omitted from the venting system. In such embodiments, vents or openings (not shown) may be provided on a top portion of the electronic headset 100. The fans 106 may then be disposed directly on the electronic headset 100. The fans 106 cover the entirety of the vents to prevent light from entering the interior 114 of the electronic headset 100. The fans 106 direct air through the vents into the interior 114.

In some embodiments, the venting system, including the fans 106, top channel 108, and air channel ring 110, may be provided in a kit. The fans 106, the top channel 108, and the air channel ring 110 may then be mounted onto the electronic headset 110. This allows users to retroactively add a venting system to an existing electronic headset 100. For example, the fans 106 and top channel 108 are mounted onto the top of the main body 116 of the electronic headset 100. The face mask 102 may attach to the main body 116 via a hook and loop fastener and may be removed from the main body 116. The air channel ring 110 may also attach via a hook and loop fastener to couple between the main body 116 of the electronic headset 100 and the face mask 102. This maintains the comfort of the face mask 102 for the user during use of the electronic headset, but allows for a venting system to be attached to any electronic headset without allowing light into the interior of the electronic headset.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified. Moreover, sub-routines or only a portion of a method described herein may be a separate method within the scope of this disclosure. Stated otherwise, some methods may include only a portion of the steps described in a more detailed method.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated by one of skill in the art with the benefit of this disclosure that in the above description of embodiments, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims following this Detailed Description are hereby expressly incorporated into this Detailed Description, with each claim standing on its own as a separate embodiment. This disclosure includes all permutations of the independent claims with their dependent claims.

Recitation in the claims of the term "first" with respect to a feature or element does not necessarily imply the existence of a second or additional such feature or element. It will be apparent to those having skill in the art that changes may be made to the details of the above-described embodiments without departing from the underlying principles of the present disclosure.

It will be obvious to those having skill in the art that many changes may be made to the details of the above-described embodiments without departing from the underlying principles of the invention. The scope of the present invention should, therefore, be determined only by the following claims.

The invention claimed is:

1. An air channel ring mountable to an electronic headset, the air channel ring comprising:
    a body to partially encompass an interior portion of the electronic headset, the body comprising a top portion, side portions, and bottom portions, the top portion to extend along a top of the interior portion of the electronic headset, the side portions each to extend along opposing sides of the interior portion of the electronic headset, and the bottom portions each to extend along distinct portions of a bottom of the interior portion of the electronic headset, wherein the bottom portions are offset from each other and a portion of the bottom of the interior portion of the electronic headset is unencompassed by the body;
    a plurality of vents disposed in the body of the air channel ring and configured to deliver air from an exterior of the electronic headset to the interior portion of the electronic headset, wherein the plurality of vents comprises:
        a one or more inlet vents disposed in the body and configured to receive the air from the exterior of the electronic headset; and
        a plurality of interior vents disposed in the body that are configured to direct the air to the interior portion of the electronic headset; and
    a lumen disposed within the body of the air channel ring that connects the one or more inlet vents and the plurality of interior vents.

2. The air channel ring of claim 1, wherein the plurality of vents are apertures that extend from an outer surface of the body to an inner surface of the body, wherein the inner surface of the body faces toward the interior portion of the electronic headset.

3. The air channel ring of claim 1, wherein the one or more inlet vents are disposed in the top portion of the body of the air channel ring.

4. The air channel ring of claim 1, wherein the plurality of vents further comprise a plurality of outlet vents that are disposed in the body that are configured to direct the air from the interior portion of the electronic headset to the exterior of the electronic headset.

5. The air channel ring of claim 4, wherein the plurality of outlet vents are disposed in the bottom portions of the body of the air channel ring.

6. The air channel ring of claim 5, wherein the plurality of outlet vents are apertures that extend from an outer surface of the body to an inner surface of the body, wherein the inner surface of the body faces toward the interior portion of the electronic headset.

7. The air channel ring of claim 1, wherein the one or more inlet vents are apertures that extend from an outer surface of the body to the lumen disposed within the body.

8. The air channel ring of claim 1, wherein the plurality of interior vents are apertures that extend from the lumen disposed within the body to an inner surface of the body, wherein the inner surface of the body faces toward the interior portion of the electronic headset.

9. The air channel ring of claim 1, wherein the plurality of vents further comprise a plurality of outlet vents that are disposed in the bottom portions of the air channel ring, wherein the plurality of outlet vents are apertures that extend from an outer surface of the body to an inner surface of the body and the plurality of outlet vents are not connected to the lumen.

10. The air channel ring of claim 1, wherein the air channel ring is fabricated from a flexible hard plastic.

11. The air channel ring of claim 1, further comprising a top channel coupled to a fan that provides the air from the exterior of the electronic headset, the top channel disposed above the top portion of the body and comprising a plurality of outlets, wherein a first outlet directs air downward to the plurality of inlet vents.

12. The air channel ring of claim 11, wherein the top channel further comprises a second outlet that directs air orthogonal to the air channel ring toward a user of the electronic headset.

13. The air channel ring of claim 1, wherein the top portion of the body comprises a concave configuration.

14. The air channel ring of claim 1, wherein the top portion of the body comprises a straight configuration.

15. An air channel ring mountable between an electronic headset and a foam mask that abuts to a user's face, the air channel ring comprising:
- a body that extends along a top of an enclosed interior portion of the electronic headset and curves around sides and underneath the enclosed interior portion;
- one or more inlet vents disposed in the body that are configured to receive air from the exterior of the electronic headset;
- a plurality of interior vents disposed in the body that are configured to direct the air to the enclosed interior portion of the electronic headset; and
- a lumen disposed within the body of the air channel ring that connects the one or more inlet vents and the plurality of interior vents,
- wherein the enclosed interior portion of the electronic headset is partially defined by the electronic headset and the user's face.

16. The air channel ring of claim 15, further comprising a plurality of outlet vents that are disposed in the bottom portions of the air channel ring, wherein the plurality of outlet vents are apertures that extend from an outer surface of the body to an inner surface of the body and the plurality of outlet vents are not connected to the lumen.

17. The air channel ring of claim 15, further comprising a top channel coupled to a fan that provides the air from the exterior of the electronic headset, the top channel is disposed above a top portion of the body, wherein an outlet of the top channel directs air downward to the plurality of inlet vents.

* * * * *